(12) United States Patent
Choi et al.

(10) Patent No.: US 6,590,429 B2
(45) Date of Patent: Jul. 8, 2003

(54) DATA RECEIVERS FOR REPRODUCING DATA INPUT SIGNALS AND METHODS FOR DETECTING DATA SIGNALS IN DATA INPUT RECEIVERS

(75) Inventors: Jung-Hwan Choi, Kyungki-do (KR); Kwang-Sook Noh, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/086,675

(22) Filed: Feb. 28, 2002

(65) Prior Publication Data

US 2003/0011406 A1 Jan. 16, 2003

Related U.S. Application Data

(60) Provisional application No. 60/305,928, filed on Jul. 16, 2001.

(51) Int. Cl.$^7$ ................................................. H03K 5/22
(52) U.S. Cl. ............................ 327/74; 327/77; 327/563
(58) Field of Search ............................ 327/74–76, 77, 327/52, 65, 68, 69, 165, 560–563; 330/252

(56) References Cited

U.S. PATENT DOCUMENTS

| 4,504,975 | A | * | 3/1985 | Jarret et al. ..................... 327/76 |
| 6,160,423 | A | | 12/2000 | Haq |
| 6,373,295 | B2 | * | 4/2002 | Kadanka et al. ............... 327/74 |
| 6,429,735 | B1 | * | 8/2002 | Kuo et al. ..................... 327/563 |
| 6,456,170 | B1 | * | 9/2002 | Segawa et al. ................ 327/54 |

* cited by examiner

Primary Examiner—Toan Tran
(74) Attorney, Agent, or Firm—Marger Johnson & McCollom

(57) ABSTRACT

Data input receivers reproduce data signals, and methods detect data signals in data input receivers. The invention receives an input data signal and two reference signals, which may be complementary. A first voltage difference between the input data signal and the first reference signal is amplified, and a second voltage difference between the input data signal and the second reference signal is amplified. The amplified first voltage difference and the amplified second voltage difference are received on the same pair of output terminals, which are then compared to generate the reproduced data signal.

17 Claims, 14 Drawing Sheets

DATA RECEIVERS FOR REPRODUCING DATA INPUT SIGNALS AND METHODS FOR DETECTING DATA SIGNALS IN DATA INPUT RECEIVERS

CROSS REFERENCE TO RELATED APPLICATIONS

This application claims priority from U.S.A. Provisional Application No. 60/305,928, filed on Jul. 16, 2001, which is hereby incorporated by reference.

BACKGROUND OF THE INVENTION

1. Field of the Invention

The present invention is related to the field of semiconductor devices, and more specifically to data input receivers for receiving and reproducing data signals, and methods for detecting data signals in data input receivers.

2. Description of the Related Art

Semiconductor devices process data that is provided as digital signals. These typically encode information as a "one" (at a high voltage) or a "zero" (at a low voltage).

Semiconductor devices are becoming progressively smaller and faster. The circuits within them are becoming packed more densely, and are spending less power. To accommodate these trends, there is a desire to have signals that carry data change more quickly from representing one value to the next, and to be provided at smaller voltage differences.

Semiconductor devices often pass data signals between each other. A device receives such data signals, and must determine whether each is a zero or a one. This has proven difficult, as data signals become attenuated, and more subject to noise.

Accordingly semiconductor devices now sometimes incorporate a separate component, which is called a data receiver. Other times, data receivers are standalone devices. Data receivers receive such data signals, and determine whether each is a zero or a one.

Data receivers have not been implemented very successfully in the prior art. They solve some of the problems of attenuation and noise, but tend to run into fundamental limits. These are described below.

Referring to FIG. 1A, a first data receiver 100 in the prior art is described. The scheme of FIG. 1A uses single reference signaling, and is also called pseudo differential.

Receiver 100 receives N data signals DATA1, DATA2, ..., DATAN, and a single reference voltage VREF. Each signal is received on a separate line. Therefore the scheme uses N+1 input lines. Receiver 100 detects the voltages on the input lines, and outputs data signals DOUT1, DOUT2, ..., DOUTN.

Referring to FIG. 1B, each data signal DATAi is a "1" if it is higher than VREF, and a "0" if lower than VREF. Accordingly, a voltage difference DD1 must be detected.

Referring to FIG. 1C, a comparator 130 is shown. Device 100 has at least one such comparator 130 for each received data signal DATAi. Each comparator 130 receives one of the data signals DATAi in the positive terminal, and the reference voltage VREF in the negative terminal. Each comparator 130 then outputs the respective output signal DOUTi. The fundamental limit is whether DD1 exceeds the noise level.

FIG. 1D is a timing chart that illustrates design requirements on the incoming data signals. For detection to work well, signal DATAi must have a large swing to exceed the noise level. This means that a "1" must be a voltage higher than a high threshold voltage VIH, and a "0" must be a voltage lower than a low threshold voltage VIL. Otherwise, detection is susceptible to electrical noise.

The device of FIG. 1A cannot be used reliably in high speed systems. This is due increased noise, and also due to voltage attenuation through transmission line, as data transmission speed increases.

Referring to FIG. 2A, a second data receiver 200 in the prior art is described. The scheme of FIG. 2A uses differential signaling, and is also called fully differential.

Receiver 200 receives 2N data signals DATA1, /DATA1, DATA2, /DATA2, ..., DATAN, /DATAN, but no reference voltage. Each data signal is received on a separate line, and therefore the scheme uses 2N input lines. Receiver 200 detects the voltages on the input lines, and outputs data signals DOUT1, DOUT2, ..., DOUTN, and also optionally /DOUT1, /DOUT2, ..., /DOUTN.

Referring to FIG. 2B, each data value is denoted by a pair of signals, working together. A value of "1" is signified by having DATAi be "high" while simultaneously /DATAi is "low". Each data signal is "0" otherwise. A backslash "/" signifies a complementary signal. Accordingly, data signal /DATAi is also called the complement of data signal DATAi.

Referring to FIG. 2C, a comparator 230 is shown. Device 200 has one such comparator 230 for each pair of received data signals DATAi, /DATAi. Each comparator 230 receives one of the data signals DATAi in the positive terminal, and the complementary /DATAi in the negative terminal. Each comparator 230 then outputs the respective output signal DOUTi, and also optionally the complement /DOUTi.

The fundamental limit is whether the comparator input DD2 exceeds the noise level. Device 200 can tolerate a smaller swing in the voltage of each data signal, since it uses two signals together. Accordingly, it can receive data at a higher speed than device 100.

Data receiver 200, however, requires 2N data lines compared to the N+1 of data receiver 100. This burdens the system, and requires a larger package size, which is contrary to present trends.

Referring to FIG. 3A, a third data receiver 300 in the prior art is described, which uses a double reference signaling scheme. Receiver 300 is disclosed in U.S. Pat. No. 6,160,423.

Receiver 300 receives N data signals DATA1, DATA2, ..., DATAN, and two reference voltages VTR, /VTR. Each signal is received on a separate line. Therefore the scheme uses N+2 input lines. Receiver 300 detects the voltages on the input lines, and outputs data signals DOUT1, DOUT2, ..., DOUTN.

Referring to FIG. 3B, the two reference voltages VTR, /VTR are complementary to each other, and oscillate. They toggle, so that they remain complementary.

Referring to FIG. 3C, detection circuits 320, 330 of device 300 are shown. Circuit 320 produces intermediate reference voltages VT, /VT, which are delayed in processing by the amount it takes to process through one comparator and two inverters. This way they are synchronized with signal DOUTi, as will be seen from the below.

Circuit 330 is provided once for each of the input data signals DATAi. Data signal DATAi is compared with VTR, /VTR at comparators 332, 334. Outputs from comparators 332, 334 are passed through switches 342, 344, where only one of them is allowed to pass through, and become output voltage signal DOUTi. Switches 342, 344 are controlled by the outputs of XOR ("exclusive-OR") gates 352, 362, which in turn receive the output voltage DOUTi and one of intermediate reference voltages VT, /VT. Inverters 372 are provided to compensate for the processing time delay of XOR gates 352, 362, so that the system is stable.

The fundamental limitation of device 300 is that, for detection to work, the data signal DATAi must be either larger than both VTR and /VTR, or smaller than both of them, at detection time. Otherwise device 300 fails, as shown for the two instances below.

Referring to FIG. 3D, a computer simulation is shown, which investigates what happens in device 300 when an even small voltage offset (50 mV) develops between the data signal DATAi and the intermediate reference values VT, /VT. As can be seen, device 300 fails when such develops.

More particularly, the computer simulation of FIG. 3D generated an input data signal (top graph) and a resulting output signal (bottom graph). The input data signal changes to assume the input values 01110111. The intermediate reference values VT, /VT take values between 1.20 V and 1.60 V, while DATAi takes values between 1.25 V and 1.65 V. The output voltage DOUTi remains high, without tracking the input values 01110111.

Referring to FIG. 3E, another computer simulation is shown, which investigates what happens in device 300 when the data signal DATAi is attenuated to be within the intermediate reference values VT, /VT. As can be seen, device 300 fails when that happens.

More particularly, the computer simulation of FIG. 3E generated an input data signal (top graph) and a resulting output signal (bottom graph). The input data signal changes to assume the input values 01110111. The intermediate reference values VT, /VT take values between 1.15 V and 1.65 V, while DATAi takes values between 1.20 V and 1.60 V. The output voltage DOUTi remains high, without tracking the input values 01110111.

Another limitation in the prior art is a very small tolerance for skew that may develop between the data signal DATAi and the reference voltage. This necessitates making reading operation at precise times.

As semiconductor memory devices become smaller and faster, it is desired to have a data input receiver that does not suffer from any of these problems and limitations of the prior art.

BRIEF SUMMARY OF THE INVENTION

The present invention overcomes these problems and limitations of the prior art.

Generally, the present invention provides data input receivers for reproducing data signals, and methods for detecting data signals in data input receivers. The invention receives an input data signal and two reference signals, which may be complementary. The invention amplifies a first voltage difference between the input data signal and the first reference signal, and amplifies a second voltage difference between the input data signal and the second reference signal. The invention receives the amplified first voltage difference and the amplified second voltage difference on the same pair of output terminals, which are then compared to generate the reproduced data signal.

The invention results in detection with improved sensitivity over the prior art, and beyond some of the fundamental limits of the prior art. Computer simulations further demonstrate improved reliability and resilience to adverse input conditions.

The invention will become more readily apparent from the following Detailed Description, which proceeds with reference to the drawings, in which:

DETAILED DESCRIPTION OF THE PREFERRED EMBODIMENT(S)

As has been mentioned, the present invention provides data input receivers for reproducing data signals, and methods for detecting data signals in data input receivers. The invention is now described in more detail.

Figure 1A:
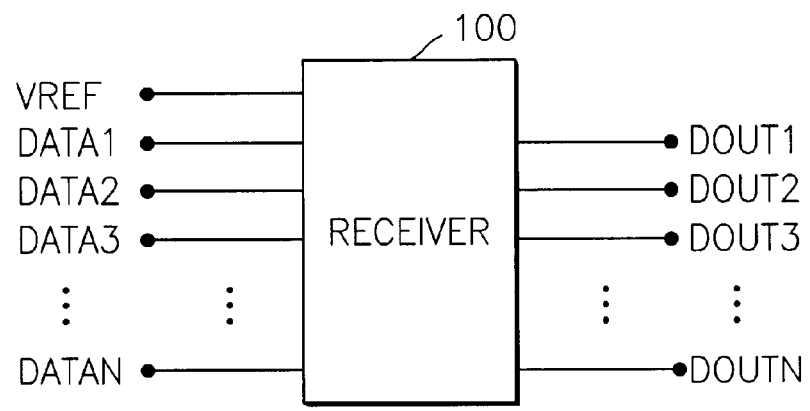
FIG. 1A is a block diagram of a first data receiver in the prior art.
Figure 1B:
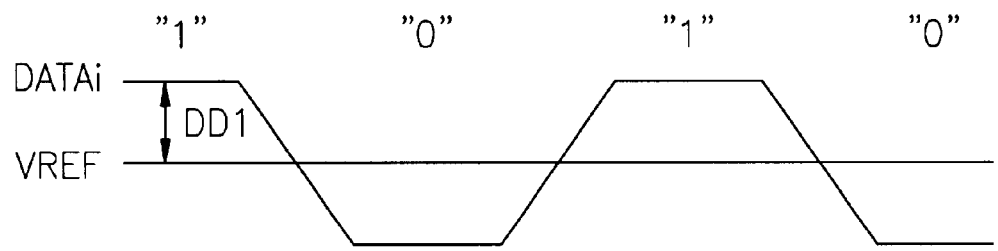
FIG. 1B is a timing diagram of a reference voltage and one of the data signals of the data receiver of FIG. 1A.
Figure 1C:
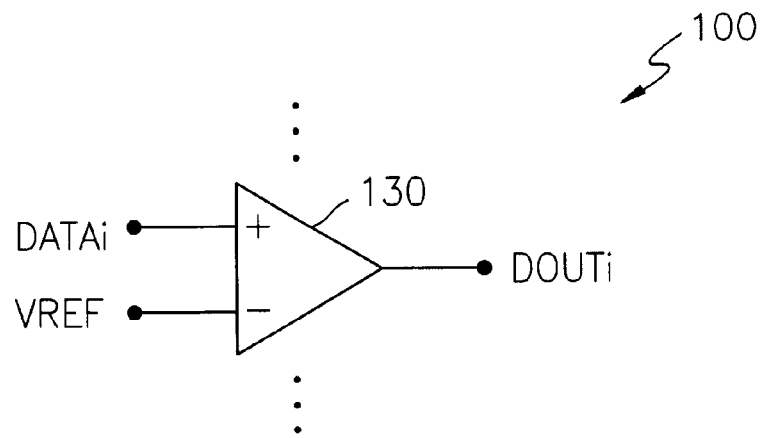
FIG. 1C is an electrical diagram of how the signals of FIG. 1B are processed in the device of FIG. 1A.
Figure 1D:
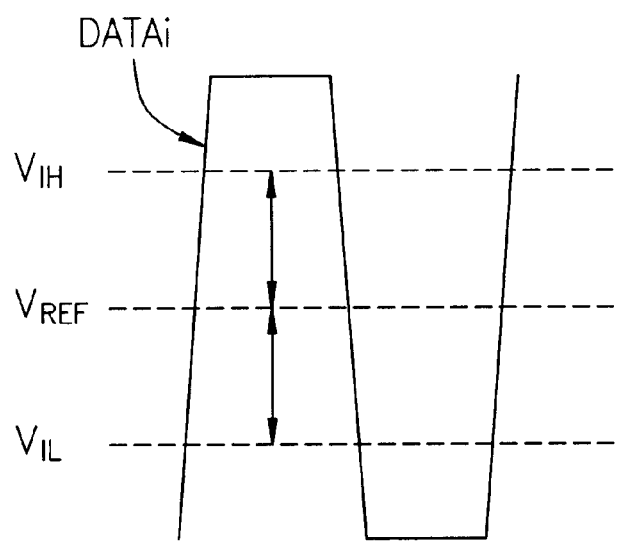
FIG. 1D is a timing diagram for illustrating data signal requirements for the device of FIG. 1A to work well.
Figure 2A:
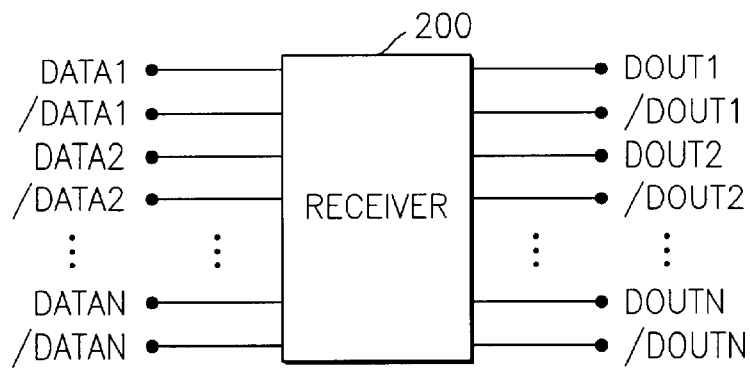
FIG. 2A is a block diagram of a second data receiver in the prior art.
Figure 2B:
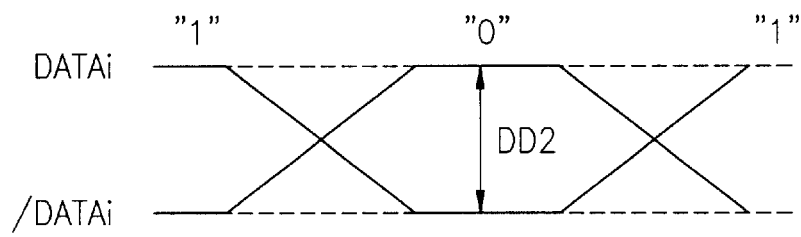
FIG. 2B is a timing diagram of the relationship of two data signals signifying one data value in the data receiver of FIG. 2A.
Figure 2C:
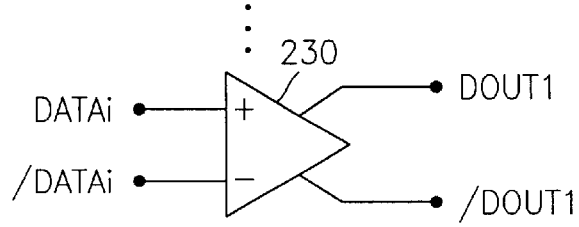
FIG. 2C is an electrical diagram of how the signals of FIG. 2B are processed in the device of FIG. 2A.
Figure 3A:
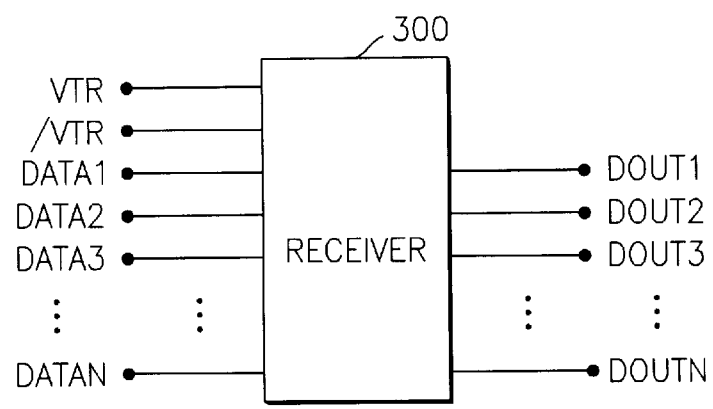
FIG. 3A is a block diagram of a third data receiver in the prior art.
Figure 3B:
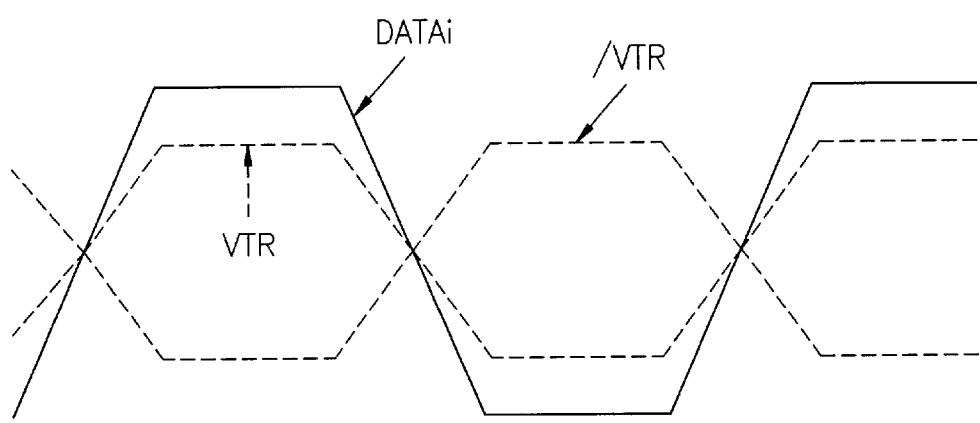
FIG. 3B is a timing diagram of the two reference voltages and one of the data signals in an ideal operation of the data receiver of FIG. 3A.
Figure 3C:
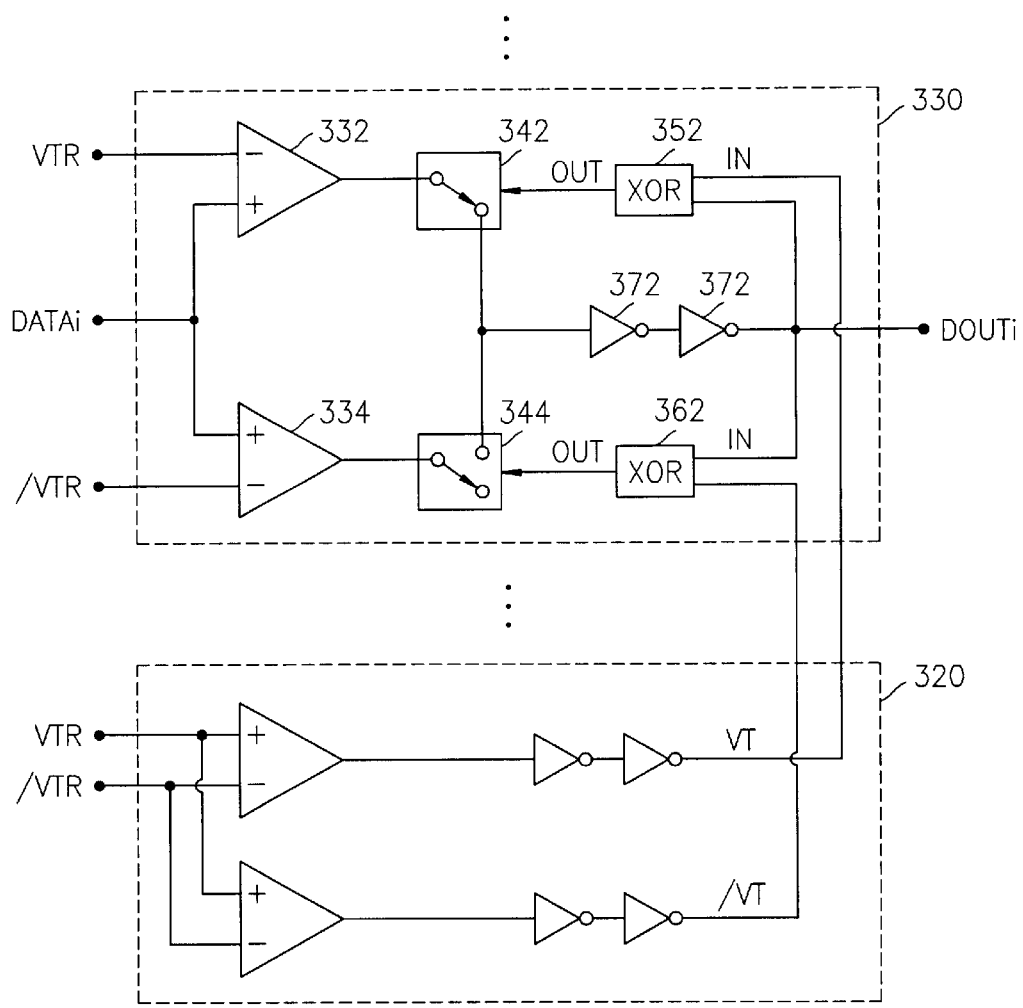
FIG. 3C is an electrical diagram of how the signals of FIG. 3B are processed in the device of FIG. 3A.
Figure 3D:
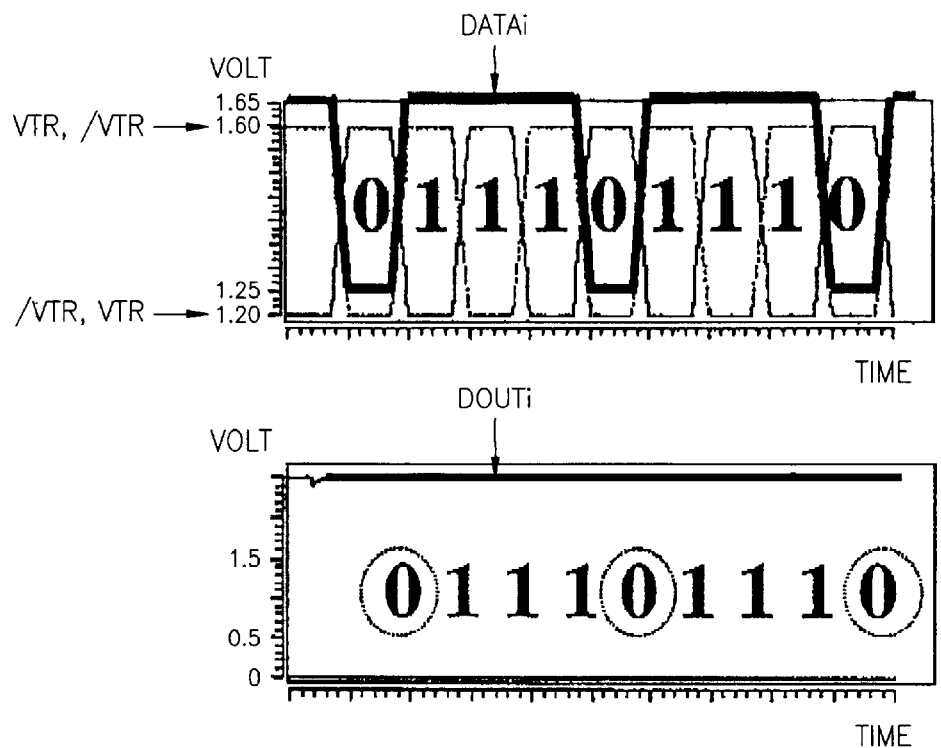
FIG. 3D is a timing diagram from a simulation demonstrating a first failure mode of the device of FIG. 3C.
Figure 3E:
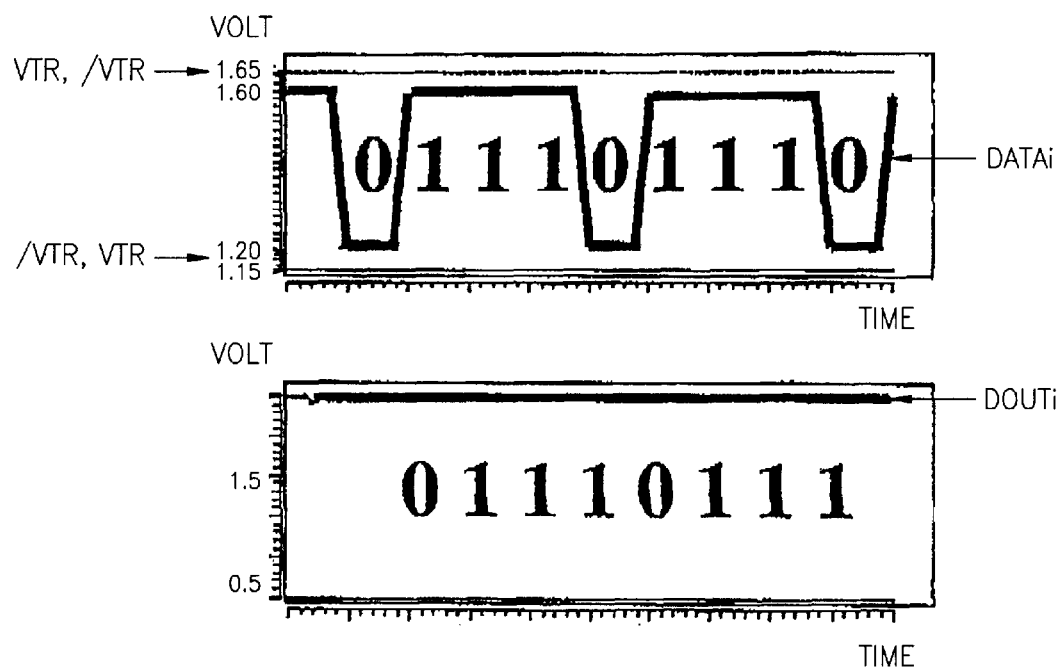
FIG. 3E is a timing diagram from a simulation demonstrating a second failure mode of the device of FIG. 3C.
Figure 4:
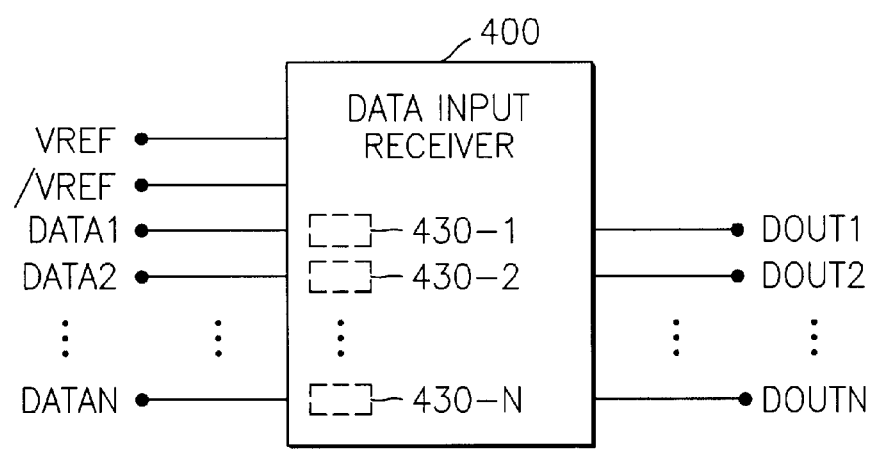
FIG. 4 is a block diagram of a data input receiver made according to an embodiment of the present invention.

Referring now to FIG. 4, a general embodiment of the invention is described. The invention provides a device 400 that is a data input receiver. Device 400 uses a double reference signaling scheme.

Receiver 400 receives N input data signals DATA1, DATA2, . . . , DATAN, and two reference voltages VREF, /VREF transmitted from another device (not shown). Receiver 400 detects the voltages on the input lines, and outputs data signals DOUT1, DOUT2, . . . , DOUTN. Data signals DOUT1, DOUT2, . . . , DOUTN are reproduced versions of the input data signals DATA1, DATA2, . . . , DATAN respectively.

Each input data signal is transmitted and received on a separate line. Therefore device 400 uses N+2 input lines. This avoids the excess number (2N) of input lines in device 200 of the prior art.

Receiver 400 includes detector circuits 430-1, 430-2, . . . , 430-N for processing respectively each one of input signals DATA1, DATA2, . . . , DATAN. Each such detector circuit 430-i also receives the two reference voltages VREF, /VREF, with which it reproduces data input signal DATAi as data output signal DOUTi.

Figure 5:
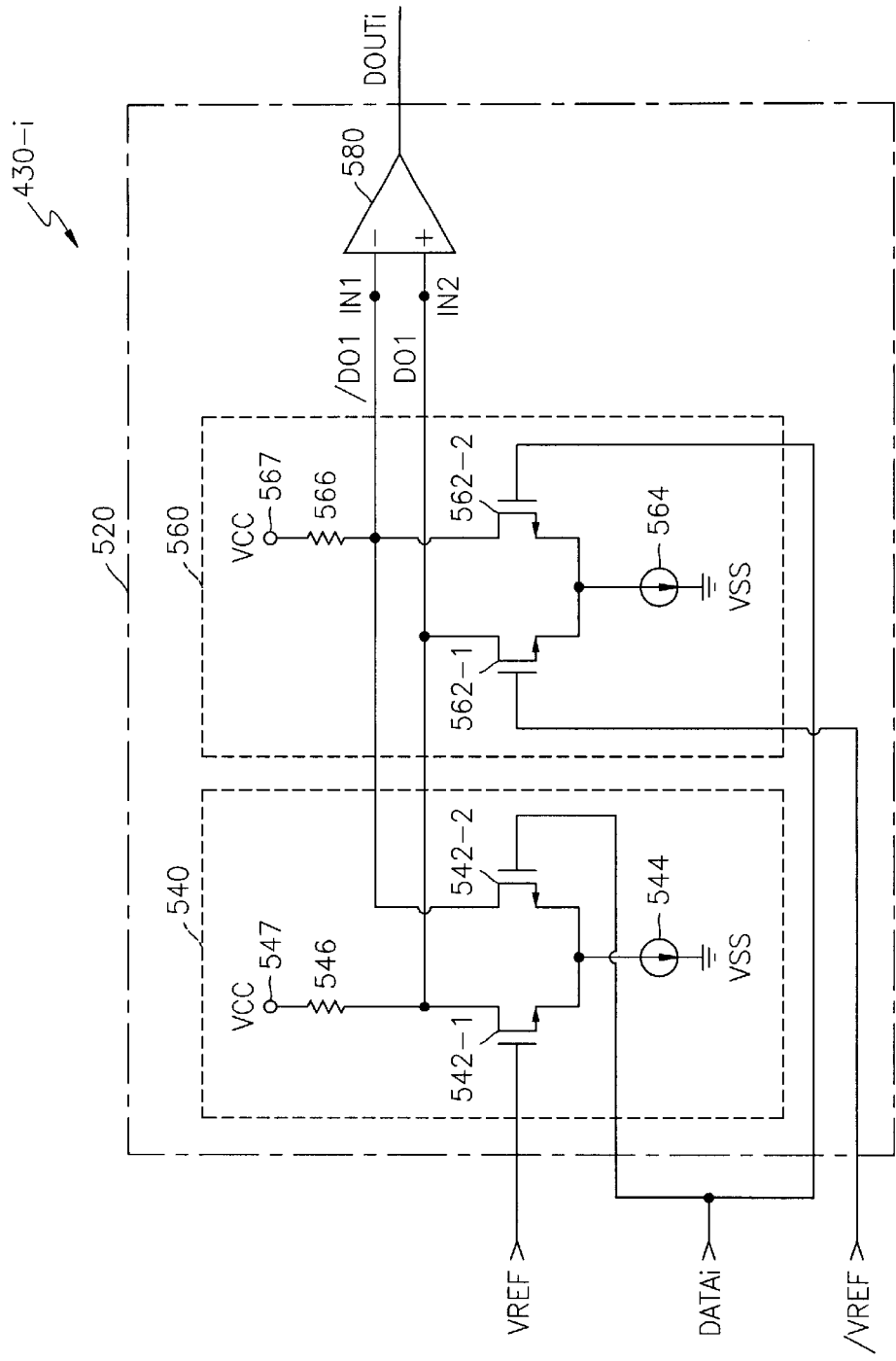
FIG. 5 is a schematic for a detector circuit made according to a first embodiment of the present invention.

Referring now to FIG. 5, a data receiver 520 is described, which is made according to a first embodiment of the invention. Receiver 520 may be used in place of detector circuit 430-i, i.e. any one of detector circuits 430-1, 430-2, . . . , 430-N of receiver 400 of FIG. 4.

Data receiver 520 includes a first differential amplifying circuit 540 and a second differential amplifying circuit 560.

First differential amplifying circuit 540 amplifies a first voltage difference between the input data signal DATAi and the first reference signal VREF. First differential amplifying circuit 540 has two output terminals IN1, IN2, where the amplified difference would ordinarily be produced, if circuit 540 were otherwise by itself.

In the embodiment of FIG. 5, first differential amplifying circuit 540 includes two transistors 542-1, 542-2, and a current source 544 sharing a common node. In addition it includes a resistor 546 coupled to a source potential VCC.

Furthermore, in the embodiment of FIG. 5, first differential amplifying circuit 540 has two input terminals to receive the input data signal DATAi and the first reference signal VREF. These two input terminals are the gates of transistors 542-1, 542-2.

In the preferred embodiment, the input data signal DATAi and the first reference signal VREF are received directly on the two input terminals. Directly means without the intervention of other components.

Second differential amplifying circuit 560 amplifies a second voltage difference between the input data signal DATAi and the second reference signal /VREF. Second differential amplifying circuit 560 has the same two output terminals IN1, IN2 as first amplifying circuit 540. This affects the output of each of circuits 540, 560.

In the embodiment of FIG. 5, second differential amplifying circuit 560 includes two transistors 562-1, 562-2 and a current source 564 sharing a common node. In addition it includes a resistor 566 coupled to a source potential VCC.

Furthermore, in the embodiment of FIG. 5, second differential amplifying circuit 560 has two input terminals to receive the input data signal DATAi and the second reference signal /VREF. These two input terminals are the gates of transistors 562-1 and 562-2.

In the preferred embodiment, the input data signal DATAi and the second reference signal /VREF are received directly on the two input terminals. Directly means without the intervention of other components.

The output terminal IN1 is coupled to a second source potential 567 through resistor 566, a first current source 544 through 542-2 transistor and a second current source 564 through transistor 562-2. Transistors 542-2, 562-2 are controlled by data signal DATAi.

The output terminal IN2 is coupled to a first source potential 547 through resistor 546, a first current source 544 through transistor 542-1, and a second current source 564 through transistor 562-1. Transistor 542-1 is controlled by the first reference signal VREF, and the gate of transistor 562-1 is controlled by the second reference signal /VREF.

Which one of the two differential amplifying circuits dominates the output node IN1 and IN2 depends on the relative magnitudes of the first and second voltage differences. For example, if the first voltage difference is larger than the second voltage difference, first differential amplifying circuit 540 dominates the output node IN1 and IN2. If, however, the second voltage difference is larger than the first voltage difference, second differential amplifying circuit 560 dominates the output node IN1 and IN2.

As a result of this circuit, an intermediate output signal DO1 is generated on node IN2, and an intermediate output signal /DO1 is generated on node IN1.

Data receiver 520 additionally includes a comparator 580. Comparator 580 has two inputs coupled to nodes IN1, IN2, thus receiving signals /DO1, DO1 respectively. Comparator 580 also has a comparator output terminal, on which the reproduced signal DOUTi is generated.

Figure 6:
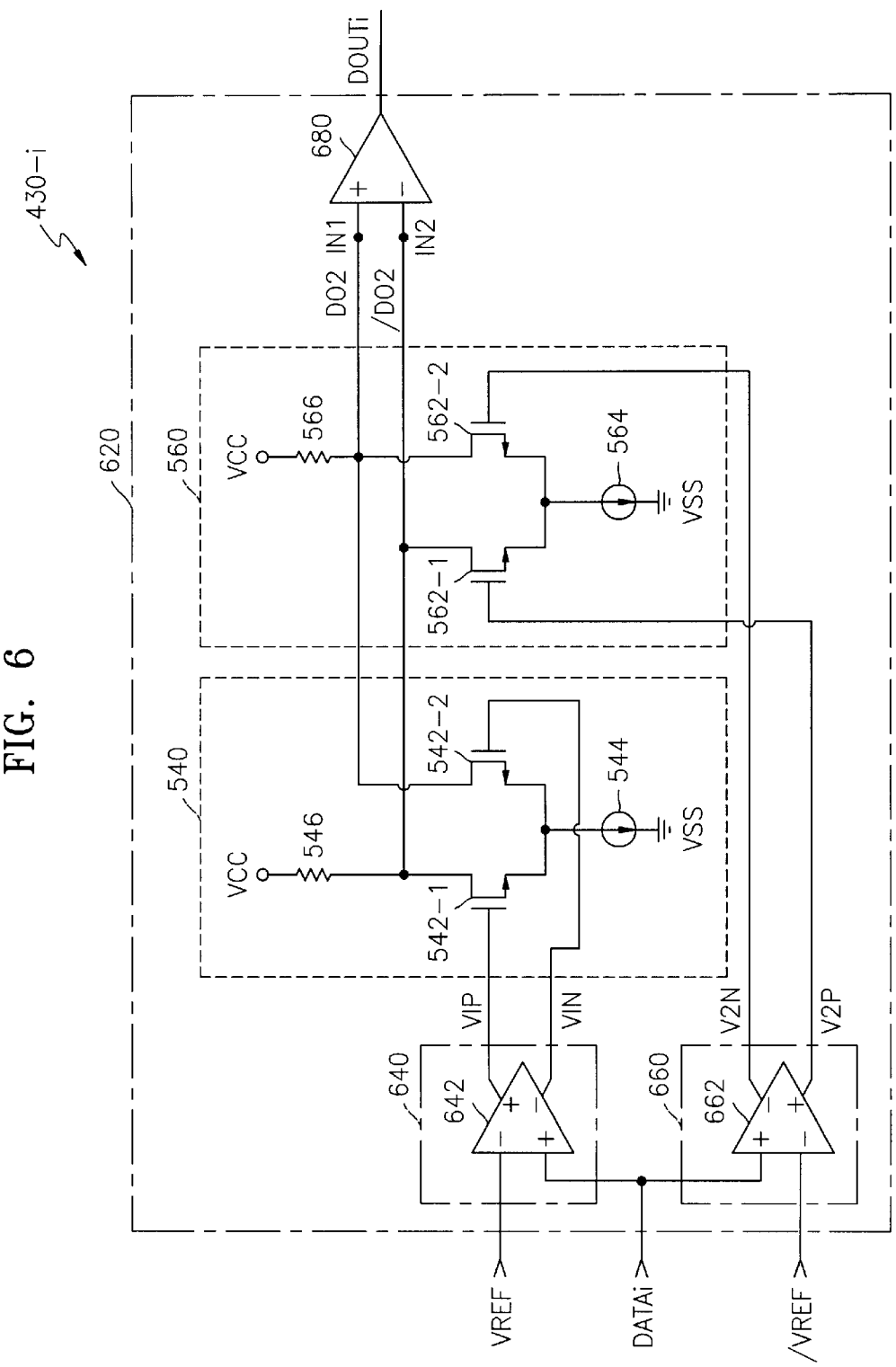
FIG. 6 is a schematic for a detector circuit made according to a second embodiment of the present invention.

Referring now to FIG. 6, a data receiver 620 is described, which is made according to a second embodiment of the invention. Receiver 620 may be used in place of detector circuit 430-i, i.e. any one of detector circuits 430-1, 430-2, . . . , 430-N of receiver 400 of FIG. 4.

Data receiver 620 includes a first differential amplifying circuit 540 and a second differential amplifying circuit 560. These may be made identically to what was described in FIG. 5.

Data receiver 620 additionally includes a first differential preamplifier 640. Preamplifier 640 preamplifies the first voltage difference between DATAi and VREF, prior to inputting this first voltage difference to first differential amplifying circuit 540. In other words, it is the preamplified first voltage difference that is input in first differential amplifying circuit 540.

First differential preamplifier 640 preferably includes a first comparator 642. First comparator 642 is adapted to receive the input data signal DATAi and the first reference signal VREF, and to generate two first output voltages V1P, V1N, as the preamplified first voltage difference.

These two first output voltages V1P, V1N are then input in amplifier 540. First output voltages V1P, V1N are preferably complementary signals or differential signals.

For example, if the signal level of the first reference signal VREF is higher than that of the data signal DATAi, then V1P has a voltage level lower than that of V1N. On the other hand, if the signal level of the first reference signal VREF is lower than that of the data signal DATAi, then V1P has a voltage level higher than that of V1N. Furthermore, if the signal level of the first reference signal VREF is the same as that of the data signal DATAi, then V1P and V1N have the same signal levels.

Data receiver 620 additionally includes a second differential preamplifier 660. Preamplifier 660 preamplifies the second voltage difference between DATAi and /VREF, prior to inputting this second voltage difference to second differential amplifying circuit 560. In other words, it is the preamplified second voltage difference that is input in second differential amplifying circuit 560.

Second differential preamplifier 660 preferably includes a second comparator 662. Second comparator 662 is adapted to receive the input data signal DATAi and the second reference signal /VREF, and to generate two complementary second output voltages V2P, V2N as the preamplified second voltage difference. These two complementary second output voltages V2P, V2N are then input in amplifier 560. Second output voltages V2P, V2N are preferably complementary signals or differential signals.

For example, if the signal level of the second reference signal /VREF is higher than that of the data signal DATAi, then V2P has a voltage level lower than that of V2N. On the other hand, if the signal level of the second reference signal /VREF is lower than that of the data signal DATAi, then V2P has a voltage level higher than that of V2N. Furthermore, if the signal level of the second reference signal /VREF is the same as that of the data signal DATAi, then V2P and V2N have the same signal levels.

As a result of this circuit, an intermediate output signal DO2 is generated on node IN1, and an intermediate output signal /DO2 is generated on node IN2.

Preamplifiers 640, 660 convert the full-swing differential inputs to limited swing gate drive signals V1P, V1N, V2P and V2N. Optionally and preferably, to reduce output delay, first and second differential amplifying circuits 540, 560 should be used with a limited-swing preamplifiers 640 and 660. The loads of the preamplifier are set so that the swing of the gate drive signals is limited to the amount needed to fully switch the differential output pair. This gives minimum output delay, because current starts to switch as soon as the output voltages V1N, V1P, V2N and V2P begin to swing.

Data receiver 520 additionally includes a comparator 680, which is similar to comparator 580. Comparator 680 has two inputs coupled to nodes IN1, IN2, thus receiving signals DO2, /DO2 respectively. Comparator 680 also has a comparator output terminal, on which the reproduced signal DOUTi is generated.

Figure 7:
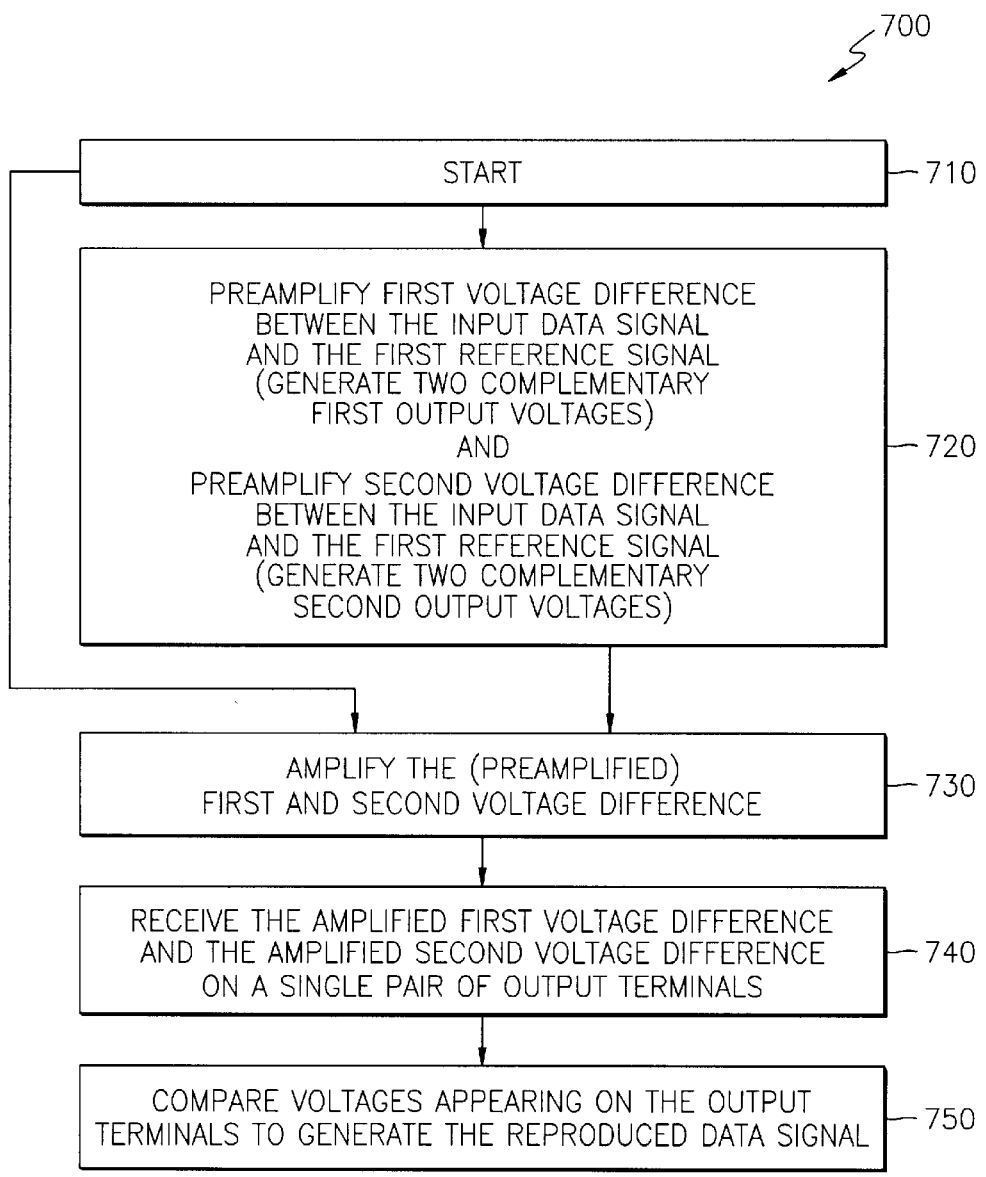
FIG. 7 is a flowchart illustrating a method according to an embodiment of the present invention.

Referring now to FIG. 7, a flowchart 700 is used to illustrate a method according to an embodiment of the invention. The method of flowchart 700 may also be practiced by device 430-i.

The process is deemed to start at a box 710.

According to an optional next box 720, a first and a second voltage differences are preamplified. The first voltage difference is a voltage difference between the input data signal DATAi and the first reference signal VREF. The second voltage difference is a voltage difference between the input data signal DATAi and the second reference signal /VREF. While preamplifying is optional for each one of the voltages, it is preferred that either both are performed, or none.

Optionally and preferably, preamplifying the first and the second voltage difference includes generating two complementary first output voltages and second output, respectively.

According to a next box 730, the first and second voltage differences are amplified. This takes place whether the first and/or second voltage differences were preamplified at box 720 or not.

According to a next box 740, the amplified first voltage difference and the amplified second voltage difference are received on a single pair of output terminals. This may take place by combining the amplified first voltage difference and the amplified second voltage difference.

According to a next box 750, voltages appearing on the output terminals are compared. This generates the reproduced data signal.

Various possible types of signals are described, for practicing the present invention. It will be appreciated that various combinations are possible.

Data signal DATAi is a single-ended signal. It value is interpreted in terms of the reference signals VREF and /VREF.

First and second reference signals VREF and /VREF are preferably complementary signals, which is why they are shown in complementary form. This is not necessary, however, and non-complementary signals may be used.

Furthermore, first and second reference signals VREF and /VREF may have fixed values, or may be oscillating. If they oscillate, they do that preferably synchronously with the data signal DATAi.

Figure 8:
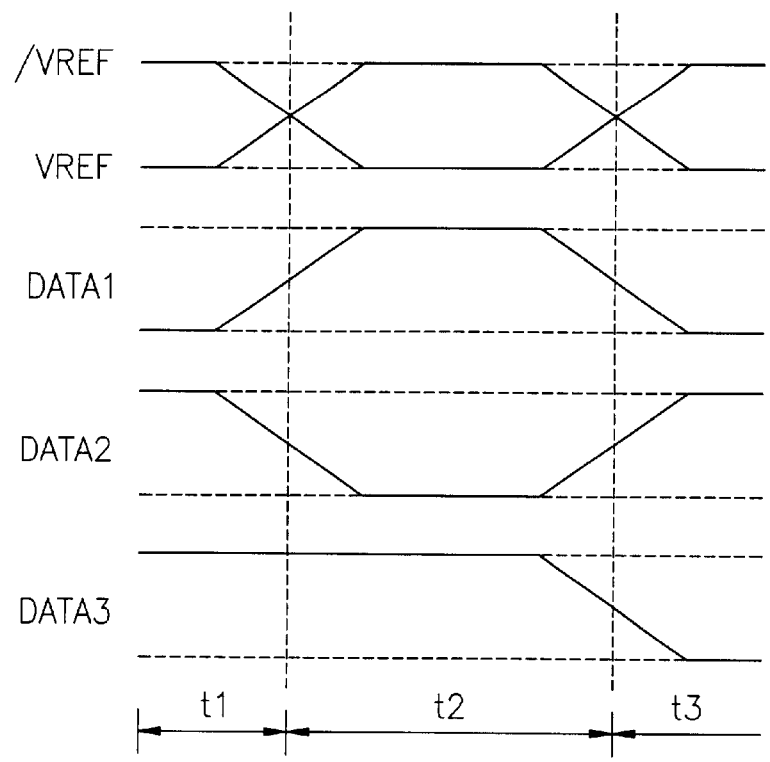
FIG. 8 is a timing diagram of two reference signals and three possible data signals for explaining an operation of the device of FIG. 6.

Referring now to FIG. 8, and also to FIG. 6, possible relationships are shown of the relative timings of the signals, and operation of the circuits.

If the phase of data signal DATA1 of FIG. 8 is the same as that of the first reference signal VREF, the second preamplifier 660 operates dominantly during intervals from t1 to t3, to detect the difference between the second reference signal /VREF and the data signal DATA1. Amplifier 560 is then dominant in generating DOUTi.

If the phase of data signal DATA2 is the same as that of the second reference signal /VREF, the first preamplifier 640 operates dominantly to detect the difference between the first reference signal VREF and the data DATA2. Amplifier 540 is then dominant in generating output signal DOUTi.

In case of data signal DATA3, both preamplifiers 640, 660 compare DATA3 with one of the first and second reference signals VREF and /VREF having the phase opposite to that of the DATA3 at each time interval. That is, the first preamplifier 640 operates dominantly during interval t1 while the second preamplifier 660 operates dominantly during intervals t2 and t3. Thus, preamplifiers 640, 660 detect the difference between input data DATAi and one of the first and second reference signals VREF and /VREF having a phase opposite to that of the data signal DATAi, and amplify the detected difference.

Figure 9:
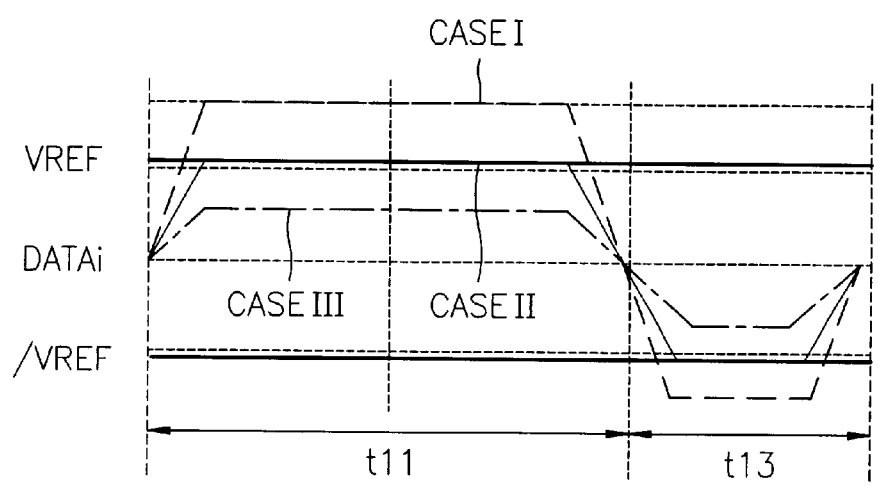
FIG. 9 is a diagram of two reference signals and three possible data signal levels for explaining an operation of the device of FIG. 6.

Referring now to FIG. 9, and also to FIG. 6, possible relationships are shown of the relative values of the signals, and operation of the circuits, for three cases, namely CASE I, CASE II, and CASE III.

CASE I refers to a case in which the amplitude of data DATAi is larger than those of reference signals VREF and /VREF. CASE II refers to a case in which the amplitude of data DATAi is the same as those of reference signals VREF and /VREF. In both CASE I and CASE II, the circuit operates as has been described above.

Case III refers to a case in which the amplitude of data DATAi is smaller than those of reference signals VREF and /VREF. During interval t11, second preamplifier 660 operates dominantly to amplify data signal DATAi, and the second amplifier 560 amplifies the difference between V2P and V2N to output DO, /DO. During interval t13, first preamplifier 640 operates dominantly to amplify data signal DATAi, and the first amplifier 540 amplifies the difference between V1P and V1N to output DO, /DO.

An important advantage of the present invention over the prior art is that detection proceeds even in CASE III. That is above and beyond the fundamental limit of the prior art of FIG. 3. This is described in more detail below.

Figure 10:
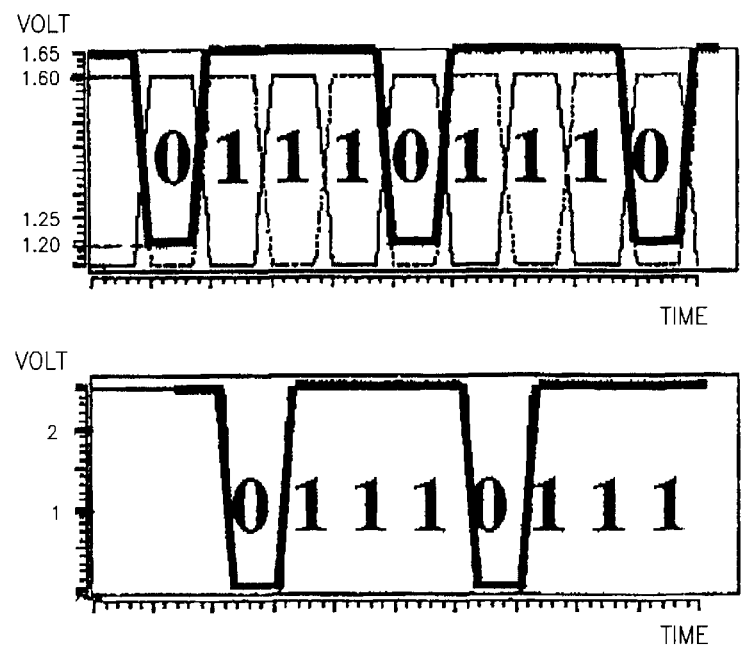
FIG. 10 illustrates a simulation of a successful performance of a circuit made according to the present invention, under the conditions of the simulation of FIG. 3D.

Referring now to FIG. 10, a computer simulation is shown, which investigates what happens in circuit 620 when a voltage offset (50 mV) develops between the data signal DATAi and the reference voltages VREF, /VREF. The simulation of FIG. 10 is performed under the identical conditions of FIG. 3D that were imposed in the prior art circuit of FIG. 3C. As can be seen, circuit 620 succeeds in detecting correctly, where the prior art failed.

More particularly, the computer simulation of FIG. 10 generated an input data signal (top graph) and a resulting output signal (bottom graph). The input data signal changes to assume the input values 01110111. The reference voltages VREF, /VREF take values between 1.20 V and 1.60 V, while DATAi takes values between 1.25 V and 1.65 V. The output voltage DOUTi tracks the input values 01110111.

Figure 11:
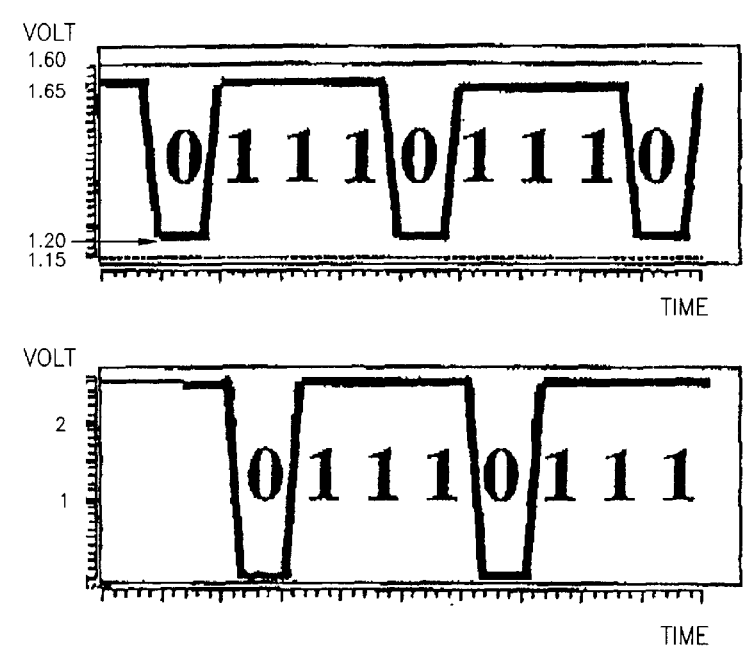
FIG. 11 illustrates another simulation of a successful performance of a circuit made according to the present invention, under the conditions of the simulation of FIG. 3E.

Referring now to FIG. 11, another computer simulation is shown, which investigates what happens in circuit 620 when the data signal DATAi is attenuated to be within the reference voltages VREF, /VREF. The simulation of FIG. 11 is performed under the identical conditions of FIG. 3E that were imposed in the prior art circuit of FIG. 3C. As can be seen, circuit 620 succeeds in detecting correctly, where the prior art failed.

More particularly, the computer simulation of FIG. 11 generated an input data signal (top graph) and a resulting output signal (bottom graph). The input data signal changes to assume the input values 01110111. The reference voltages VREF, /VREF take values between 1.15 V and 1.65 V, while DATAi takes values between 1.20 V and 1.60 V. The output voltage DOUTi tracks the input values 01110111.

Figure 12:
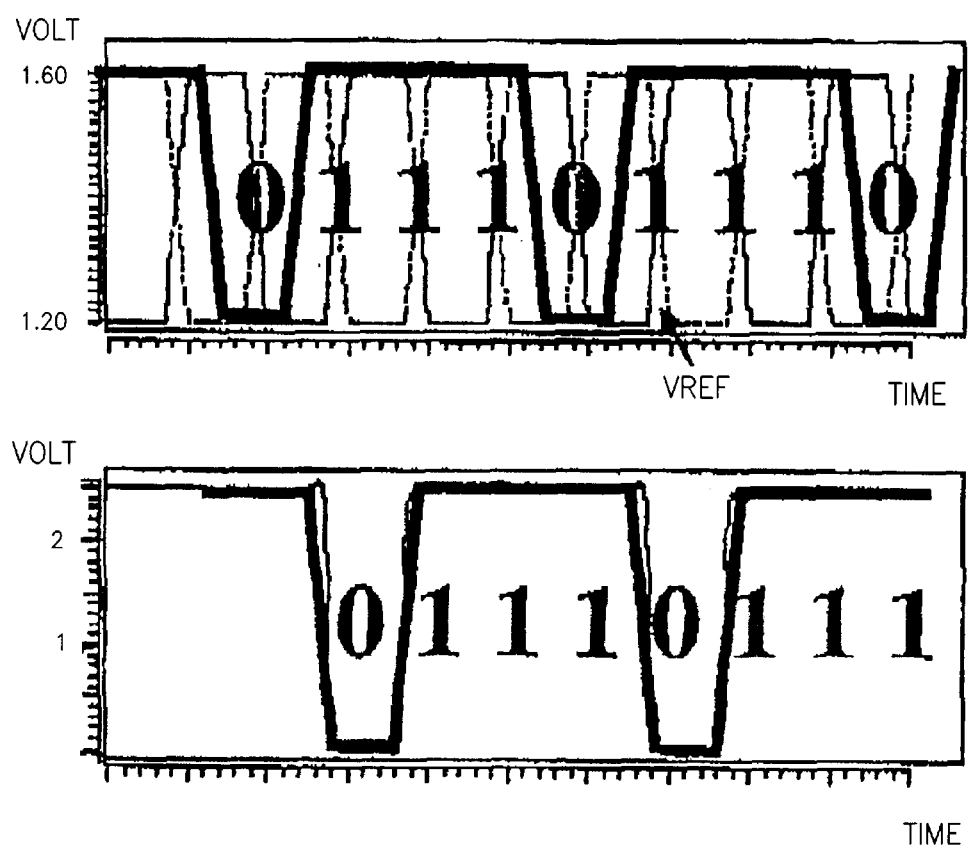
FIG. 12 illustrates yet another simulation of a successful performance of a circuit made according to the present invention, under adverse skew conditions.

Referring now to FIG. 12, yet another computer simulation is shown, which investigates what happens in circuit 620 when the data signal DATAi develops a skew from reference voltages VREF, /VREF. It will be appreciated that the invention succeeds in detecting correctly, being resilient to such adverse conditions.

More particularly, the computer simulation of FIG. 12 generated an input data signal (top graph) and a resulting output signal (bottom graph). The input data signal changes to assume the input values 01110111. The reference voltages VREF, /VREF, and also the data signal DATAi take values between 1.20 V and 1.60 V. Data signal DATAi develops a skew of up to 90° with respect to the reference voltages VREF, /VREF. Nevertheless, the output voltage DOUTi tracks the input values 01110111.

Figure 13:
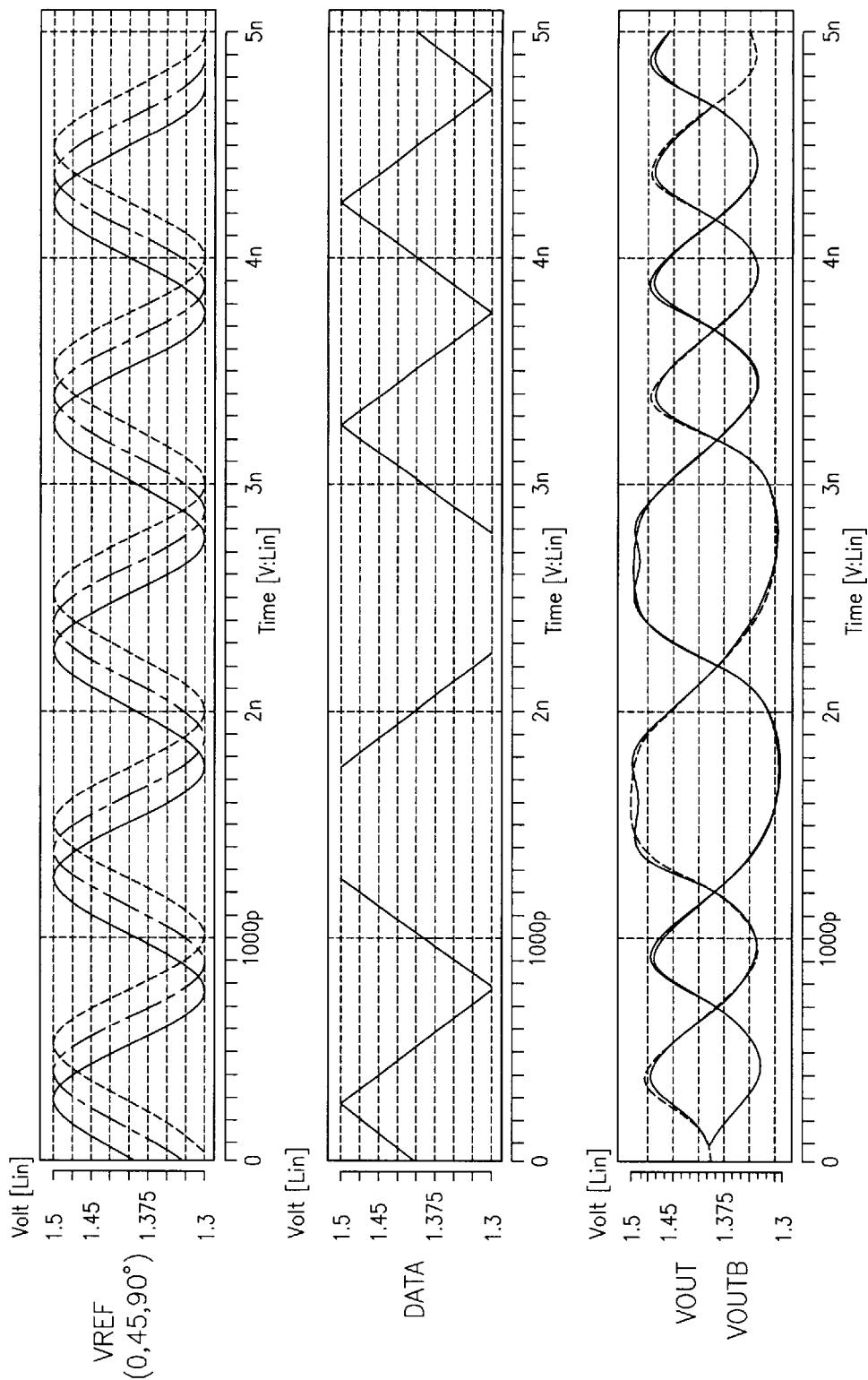
FIG. 13 illustrates one more simulation of a successful performance of a circuit made according to the present invention.

Referring now to FIG. 13, one more simulation is shown by using three timing charts, with slowly varying voltages for better illustration. In the top chart there is shown a time variation of two reference voltages VREF, /VREF, in both a regular case, and also with two time skews. In the middle chart there is shown an input data signal DATAi. In the bottom chart there are shown the resulting signals DO, and /DO, which are input in comparators 580, 680 for generating DOUTi as the reproduced input data signal. It will be appreciated that the relative magnitudes of resulting signals DO, /DO track very well the data signal DATAi.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and subcombinations of features, functions, elements and/or properties may be presented in this or a related document.

The invention claimed is:

1. A circuit to reproduce a data signal from an input data signal, comprising:
  a first differential amplifying circuit to amplify a first voltage difference between the input data signal and a first reference signal, the first differential amplifying circuit having a first and a second output terminals;
  a second differential amplifying circuit to amplify a second voltage difference between the input data signal and a second reference signal, the second differential amplifying circuit having the same first and second output terminals as the first amplifying circuit; and
  a comparator having two inputs coupled respectively with the first and second output terminals and a comparator output terminal on which to reproduce the data signal.

2. The circuit of claim 1, in which
  the first reference signal is the complementary signal of the second reference signal.

3. The circuit of claim 1, in which
  at least one of the first and second differential amplifying circuits includes two transistors and a current source sharing a common node.

4. The circuit of claim 1, in which
  the first differential amplifying circuit has two input terminals to receive the input data signal and the first reference signal, and
  the second differential amplifying circuit has two input terminals to receive the input data signal and the second reference signal.

5. The circuit of claim 1, in which
  the first differential amplifying circuit has two input terminals to receive directly the input data signal and the first reference signal, and
  the second differential amplifying circuit has two input terminals to receive directly the input data signal and the second reference signal.

6. The circuit of claim 1, further comprising:
  a first differential preamplifier to preamplify the first voltage difference prior to inputting it to the first differential amplifying circuit; and
  a second differential preamplifier to preamplify the second voltage difference prior to inputting it to the second differential amplifying circuit.

7. The circuit of claim 6, in which
  the first differential preamplifier includes a first comparator for receiving the input data signal and the first reference signal, and to generate two complementary first output voltages as the preamplified first voltage difference, and
  the second differential preamplifier includes a second comparator for receiving the input data signal and the second reference signal, and to generate two complementary second output voltages as the preamplified second voltage difference.

8. A circuit to reproduce a data signal from an input data signal, comprising:

a first input terminal;

a second input terminal;

a third input terminal, in which a first voltage difference between the input data signal and a first reference signal is for being applied across the third and the first input terminals, and a second voltage difference between the input data signal and a second reference signal is for being applied across the third and the second input terminals;

a first and a second output terminals;

a first transistor having a gate coupled with the first input terminal, a source coupled with the second output terminal, and a drain;

a second transistor having a gate coupled with the third input terminal, a source coupled with the first output terminal, and a drain;

a first current source having a first terminal coupled to the drains of the first and second transistors, and a second terminal;

a third transistor having a gate coupled with the second input terminal, a source coupled with the second output terminal, and a drain;

a fourth transistor having a gate coupled with the third input terminal, a source coupled with the first output terminal, and a drain;

a second current source having a first terminal coupled to the drains of the third and fourth transistors, and a second terminal; and a comparator having two inputs coupled respectively with the first and second output terminals, and a comparator output terminal to reproduce the data signal.

9. The circuit of claim 8, in which the second terminals of the first and second current sources are coupled to a ground node.

10. The circuit of claim 8, in which the first reference signal is for being applied to the first input terminal, the second reference signal is for being applied to the second input terminal, and the input data signal is for being applied to the third input terminal.

11. The circuit of claim 8, further comprising:

a first resistor coupled between the first output terminal and a supply node; and a second resistor coupled between the second output terminal and a supply node.

12. The circuit of claim 8, further comprising:

a first differential preamplifier to preamplify the first voltage difference prior to inputting it to the first and third input terminals; and a second differential preamplifier to preamplify the second voltage difference prior to inputting it to the second and third input terminals.

13. The circuit of claim 12, in which the first differential preamplifier includes a first comparator for receiving the input data signal and the first reference signal, and to generate two complementary first output voltages as the preamplified first voltage difference, and the second differential preamplifier includes a second comparator for receiving the input data signal and the second reference signal, and to generate two complementary second output voltages as the preamplified second voltage difference.

14. A circuit to reproduce a data signal from an input data signal, comprising:

a first and a second output terminals;

a comparator having two inputs coupled respectively with the first and second output terminals, and a comparator output terminal to reproduce the data signal;

a first transistor having a gate, a source coupled with the second output terminal, and a drain;

a second transistor having a gate, a source coupled with the first output terminal, and a drain;

a first current source having a first terminal coupled to the drains of the first and second transistors, and a second terminal;

a third transistor having a gate coupled with the gate of the second transistor, a source coupled with the second output terminal, and a drain;

a fourth transistor having a gate, a source coupled with the first output terminal, and a drain;

a second current source having a first terminal coupled to the drains of the third and fourth transistors, and a second terminal; and a first differential preamplifier to preamplify a first voltage difference between the input data signal and a first reference signal, and to apply the preamplified first voltage difference across the gates of the first and the second transistors; and a second differential preamplifier to preamplify a second voltage difference between the input data signal and a second reference signal, and to apply the preamplified second voltage difference across the gates of the third and the fourth transistors.

15. A method for reproducing a data signal from an input data signal and two reference signals, comprising:

amplifying a first voltage difference between the input data signal and a first one of the reference signals;

amplifying a second voltage difference between the input data signal and a second one of the reference signals;

receiving simultaneously the amplified first voltage difference and the amplified second voltage difference on a single pair of output terminals; and comparing voltages appearing on the pair of output terminals to reproduce the data signal.

16. The method of claim 15, further comprising:

preamplifying the first voltage difference prior to amplifying it; and preamplifying the second voltage difference prior to amplifying it.

17. The method of claim 16, in which preamplifying the first voltage difference includes generating two complementary first output voltages, and preamplifying the second voltage difference includes generating two complementary second output voltages.

* * * * *